(12) United States Patent
Shoyama

(10) Patent No.: US 8,203,631 B2
(45) Date of Patent: Jun. 19, 2012

(54) SOLID-STATE IMAGING DEVICE

(75) Inventor: Hideki Shoyama, Fukuoka (JP)

(73) Assignee: Sony Corporation, Tokyo (JP)

( * ) Notice: Subject to any disclaimer, the term of this patent is extended or adjusted under 35 U.S.C. 154(b) by 163 days.

(21) Appl. No.: 12/815,862

(22) Filed: Jun. 15, 2010

(65) Prior Publication Data

US 2011/0019030 A1    Jan. 27, 2011

(30) Foreign Application Priority Data

Jul. 21, 2009   (JP) .................................. 2009-170586

(51) Int. Cl.
*H04N 9/64* (2006.01)
*H04N 17/02* (2006.01)

(52) U.S. Cl. ........................................ 348/246; 348/175

(58) Field of Classification Search .................. 348/175, 348/180, 181, 187, 188, 246, 247, 243, 241
See application file for complete search history.

(56) References Cited

U.S. PATENT DOCUMENTS

| | | | |
|---|---|---|---|
| 7,365,783 B2* | 4/2008 | Hashimoto et al. | 348/246 |
| 8,000,520 B2* | 8/2011 | Chang et al. | 382/149 |
| 2004/0044491 A1* | 3/2004 | Yonaga et al. | 702/118 |
| 2008/0158363 A1* | 7/2008 | Myers | 348/187 |
| 2008/0309532 A1* | 12/2008 | Lin | 341/137 |
| 2009/0063913 A1* | 3/2009 | Yamasaki et al. | 714/718 |

FOREIGN PATENT DOCUMENTS

JP   2004-93421   3/2004

* cited by examiner

*Primary Examiner* — Hung Lam
(74) *Attorney, Agent, or Firm* — Oblon, Spivak, McClelland, Maier & Neustadt, L.L.P.

(57) ABSTRACT

A solid-state imaging device includes: a pixel array section having a two-dimensional array of pixels each having a photoelectric conversion section; a memory storing pixel data output from the pixel array section; a correction section reading the pixel data from the memory, and performing a correction process on the pixel data; a control section controlling writing and reading of data into and from the memory; an external interface to output the pixel data subjected to the correction process; and a test-data output section outputting test data. The control section writes the test data in a same writing sequence as a sequence of writing the pixel data output from the pixel array section into the memory, and reads the test data in a same reading sequence as a sequence of reading the pixel data output from the pixel array section from the memory, and outputting the pixel data via the external interface.

6 Claims, 5 Drawing Sheets

FIG.5
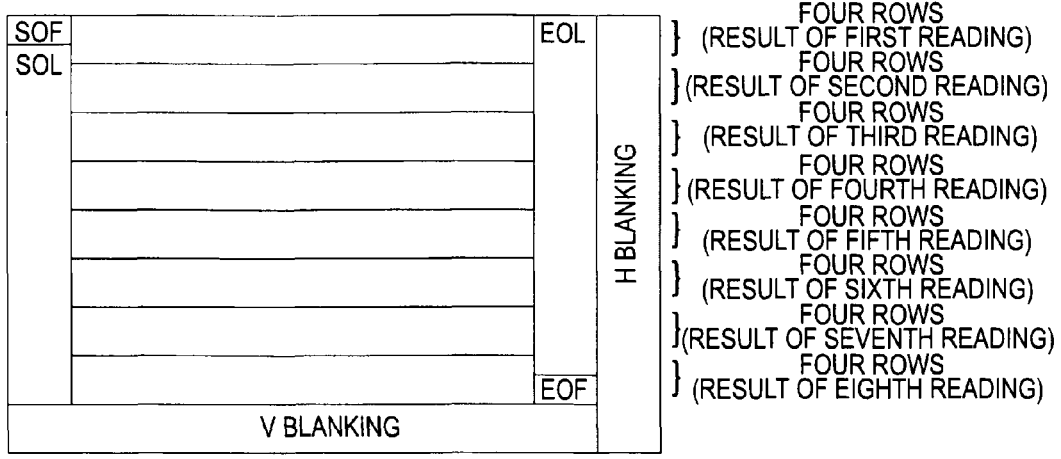
FIG.6A
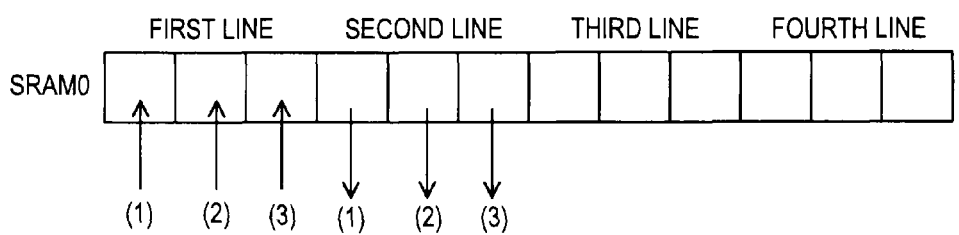
FIG.6B

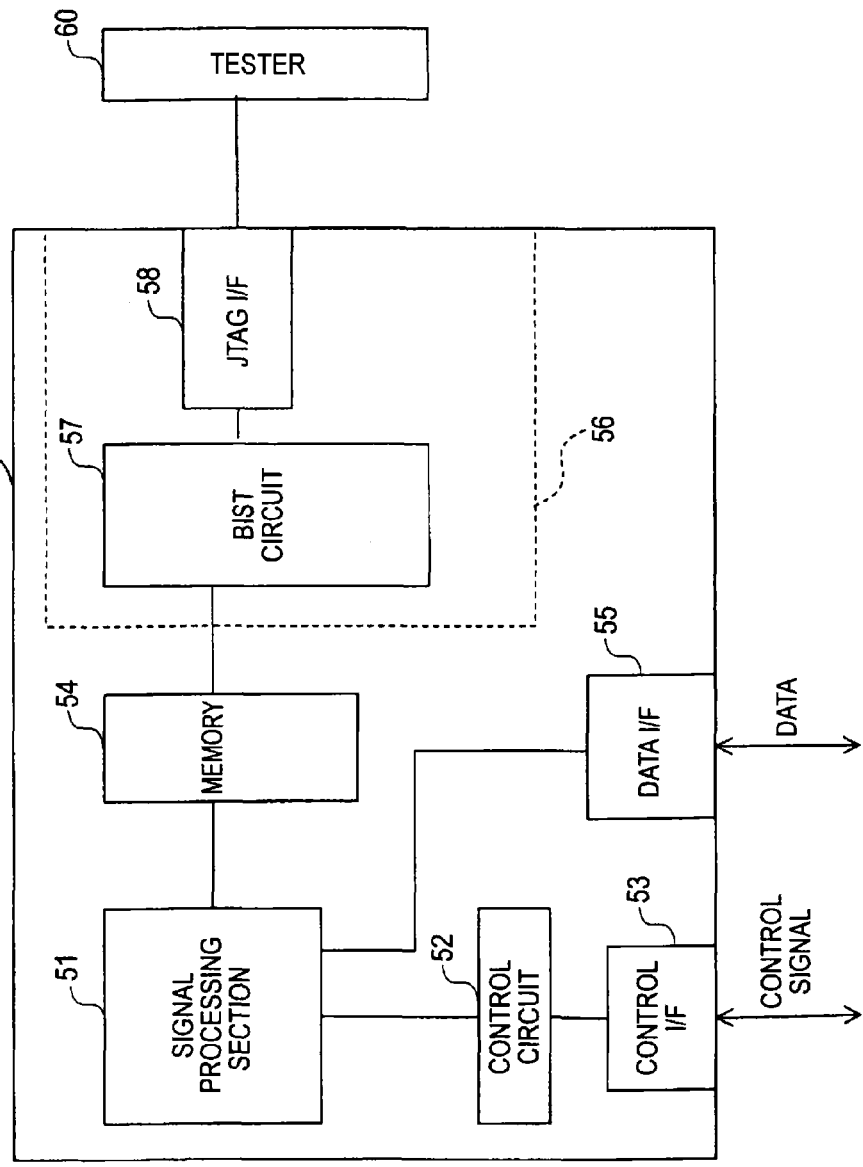

SOLID-STATE IMAGING DEVICE

BACKGROUND OF THE INVENTION

1. Field of the Invention

The present invention relates to a solid-state imaging device, and, more particularly, to a solid-state imaging device having a memory to be used at the time of performing a correction process.

2. Description of the Related Art

A solid-state imaging device for use in a cellular phone, a digital still camera, etc. has a memory which is used at the time of performing a correction process. There is a solid-state imaging device in which a memory test circuit for testing such a memory is connected to the memory (see, for example, JP-A-2004-93421 (Patent Document 1)).

FIG. 7 shows the configuration of an electronic circuit having a memory test circuit according to a related art. As shown in FIG. 7, an electronic circuit 50 includes a signal processing section 51, a control circuit 52, a control interface (I/F) 53, a memory 54, a data interface (I/F) 55, and memory test circuit 56. The memory test circuit 56 includes a BIST circuit 57, and a JTAG interface (I/F) 58.

The control circuit 52 performs the general control of the electronic circuit 50 based on a control signal input via the control interface 53. The signal processing section 51 performs writing/reading of predetermined data in/from the memory 54, and performs predetermined signal processing on the data which is in turn output via the data interface 55.

The BIST circuit 57 generates a test pattern for testing the memory 54 based on a control signal input via the JTAG interface 58, and tests the memory 54 based on the test pattern. The result of the test is output to a tester 60 via the JTAG interface 58.

SUMMARY OF THE INVENTION

Electronic circuits having the foregoing BIST circuit have the following problems. First, the JTAG interface 58 is needed for communication between the BIST circuit 57 and the tester 60.

Secondly, the existing BIS circuit uses a March algorithm or the like which undesirably increases the scale of the circuit for generating a test pattern. Further, it takes time to output a bit map for checking defective information on all the addresses in the memory.

It is therefore desirable to provide a solid-state imaging device which implements fast memory testing while making the circuit scale smaller.

According to an embodiment of the present invention, there is provided a solid-state imaging device including a pixel array section having a two-dimensional array of a plurality of pixels each having a photoelectric conversion section, a memory that stores pixel data output from the pixel array section, a correction section that reads the pixel data stored in the memory from the memory, and performs a correction process on the pixel data, a control section that controls writing and reading of data into and from the memory, an external interface used to output the pixel data subjected to the correction process, and a test-data output section that outputs test data, wherein the control section writes the test data output from the test-data output section in a same writing sequence as a sequence of writing the pixel data output from the pixel array section into the memory, and reads the test data written in the memory in a same reading sequence as a sequence of reading the pixel data output from the pixel array section from the memory, and outputting the pixel data via the external interface.

According to another embodiment of the invention, the solid-state imaging device may include a sync-code adding section that adds a sync code to the test data read from the memory, and outputs the test data added with the sync code via the external interface.

According to still another embodiment of the invention, in the solid-state imaging device, the memory may be a line buffer for storing k lines of test data, and the test-data output section may output plural kinds of test data each kind containing k lines of test data.

According to yet another embodiment of the invention, in the solid-state imaging device, the test-data output section may be capable of outputting k lines of first test data having a sequence of "0s" as a data value, k lines of second test data having a sequence of "1s" as a data value, k lines of third test data having an alternate sequence of "0s" and 1s" as a data value, and k lines of fourth test data having an alternate sequence of 1s" and "0s" as a data value, and outputs each test data twice.

According to still yet another embodiment of the invention, the foregoing solid-state imaging device may further include a selector that selectively outputs the test data output from the test-data output section and the pixel data output from the pixel array section, wherein the control section controls the selector to change over data to be input to the memory.

According to further another embodiment of the invention, in the foregoing solid-state imaging device, the external interface may be a differential interface.

The embodiments of the invention can provide a solid-state imaging device which implements fast memory testing while making the circuit scale smaller.

BRIEF DESCRIPTION OF THE DRAWINGS

FIG. 5 is a diagram showing the data structure of image data which is output from an image interface in test mode;

FIGS. 6A and 6B are diagrams showing the relation between a memory writing sequence and memory reading sequence; and FIG. 7 is a diagram showing the configuration of an electronic circuit according to the related art.

DESCRIPTION OF THE PREFERRED EMBODIMENTS

Modes for carrying out the present invention (hereinafter called "embodiments") will be described below. The description will be given in the following order.

1. First Embodiment
2. Second Embodiment
3. Other Embodiments

1. First Embodiment

A solid-state imaging device 1 according to the first embodiment of the invention will be described below with reference to the accompanying drawings.

1-1. Configuration of Solid-state Imaging Device

Figure 1:
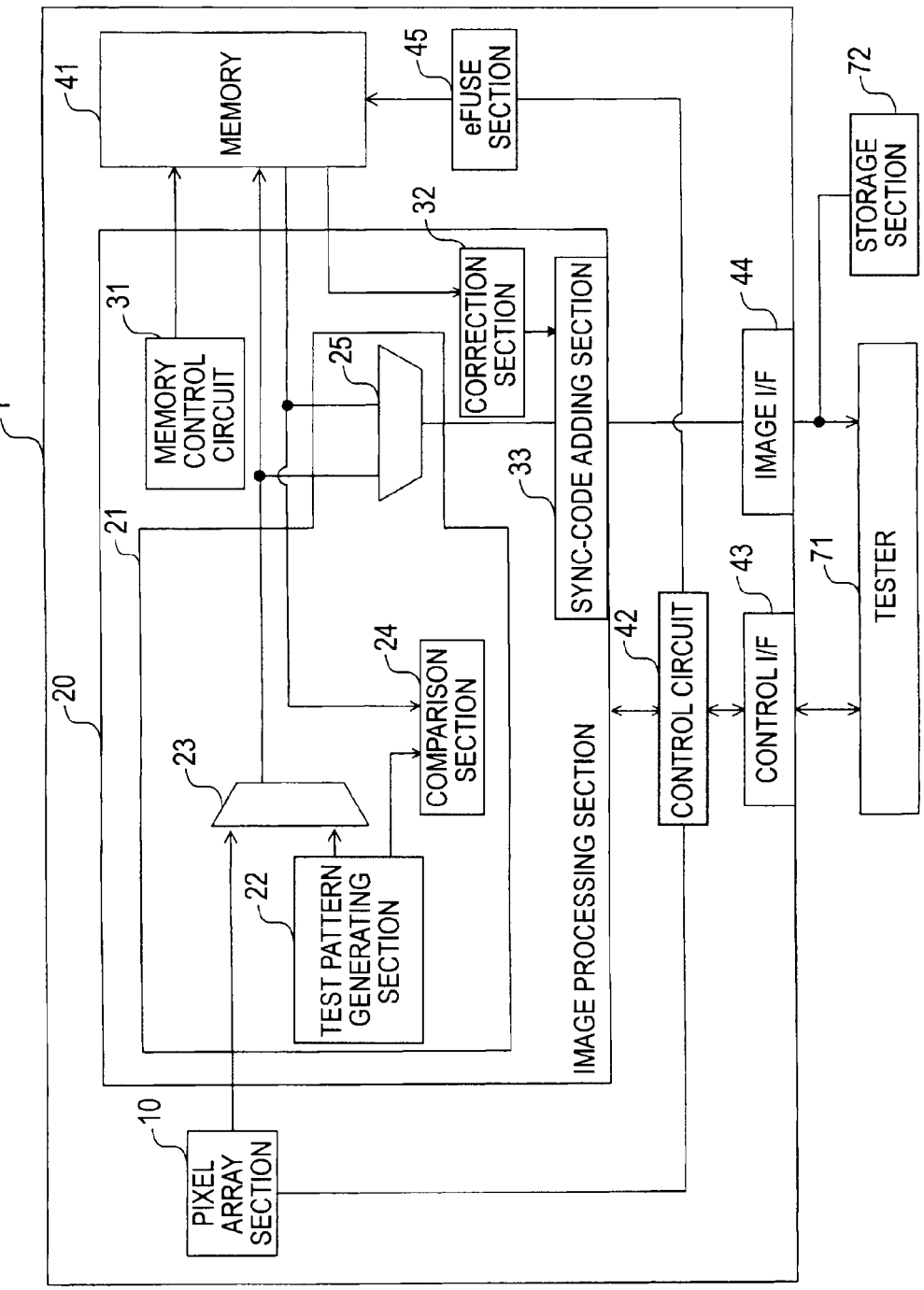
FIG. 1 is a diagram showing the configuration of a solid-state imaging device according to an embodiment of the invention.

As shown in FIG. 1, the solid-state imaging device 1 according to the embodiment includes a pixel array section 10, an image processing section 20, a memory 41, a control circuit 42, a control interface (I/F) 43, an image interface (I/F) 44, and an eFuse section 45.

The pixel array section 10 has a two-dimensional array of a plurality of pixels each having a photoelectric conversion section. The pixel array section 10 performs photoelectric conversion on imaging light of a subject, captured via a lens (not shown), using the pixels, and stores charges corresponding to the input light in the individual pixels. The pixel array section 10 reads out charges stored in the individual pixels, and outputs the charges as pixel data to the image processing section 20 via an internal A/D conversion section. According to the embodiment, the pixel array section 10 has the pixels laid out in an n×m matrix, and sequentially outputs n pixels of pixel data of each line starting from the top line under control of the control circuit 42.

The image processing section 20 temporarily stores the pixel data output from the pixel array section 10 into the memory 41. The memory 41 is a line buffer to store pixel data output from the pixel array section 10 line by line.

A correction section 32 reads out the pixel data stored in the memory 41 line by line, for example, and performs a predetermined correction process on the pixel data. The correction process includes, for example, noise cancellation, edge emphasis, focus adjustment, white balance adjustment, γ correction, and edge correction.

Figure 2:
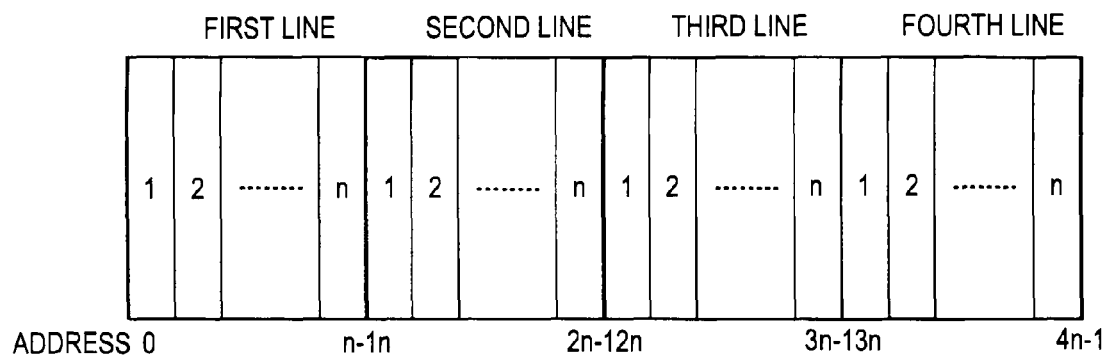
FIG. 2 is a diagram showing the structure of a memory.

FIG. 2 is a diagram showing one example of the structure of the memory 41. A line buffer which stores, for example, four lines of data is used for the memory 41. The memory 41 is configured so that n pieces pixel data can be stored in one line. The memory 41 can store 4×n pieces of pixel data. According to the embodiment, pixel data which is written/read in/from the memory 41 is 12-bit data having four bits for each of RGB. The memory 41 uses twelve memory elements to store one piece of pixel data, and one address is allocated to each unit of twelve memory elements. The number of lines, k, can be adequately set to an integer equal to or greater than 2.

The writing sequence and reading sequence of pixel data for the memory 41 are determined beforehand. The image processing section 20 writes pixel data in the memory 41 in a predetermined sequence, and reads pixel data from the memory 41 in a predetermined sequence. To store pixel data of the first line to fourth line in the pixel array section 10, for example, the image processing section 20 first reads the first line of pixel data, and then reads the second line of pixel data, the third line of pixel data, and the fourth line of pixel data in order, as shown in FIG. 2.

In case of performing noise cancellation based on the 3×3 matrix, for example, consecutive pixel data of three pixels are read from three line buffers.

The control circuit 42, which is connected with the pixel array section 10, the image processing section 20, and the eFuse section 45, performs the general control of the solid-state imaging device 1. The control interface 43 is the interface section which uses the I2C interface. According to the embodiment, the control interface 43 is used for information transmission and reception between a tester 71 connected to the solid-state imaging device 1 and the control circuit 42.

The image interface 44 is the interface section to output image data output from the image processing section 20 to outside the solid-state imaging device 1. According to the embodiment, image data is output to outside the solid-state imaging device 1 using a differential interface, such as LVDS (Low Voltage Differential Signaling).

The eFuse section 45 stops the function of a defective portion (failed memory element) of the memory 41 based on the result of comparison performed by a comparison section 24. Since the eFuse technique is well known, and is not necessary to understand the invention, its detailed description will be omitted.

1-2. Configuration of Image Processing Section

Next, the configuration of the image processing section 20 of the solid-state imaging device 1 according to the embodiment will be described specifically.

The image processing section 20 has a memory control circuit 31 which controls data writing/reading in/from the memory 41, and the correction section 32 which performs a predetermined correction process on pixel data output from the pixel array section 10. With this configuration, the image processing section 20 temporarily stores pixel data output from the pixel array section 10 in the memory 41 line by line, reads each line of pixel data from the memory 41, and performs a predetermined correction process on the pixel data.

The image processing section 20 has a sync-code adding section 33 which generates image data obtained by adding a sync code to pixel data, and outputs the pixel data undergone the correction process in the correction section 32, as image data, via the sync-code adding section 33.

Figure 3:
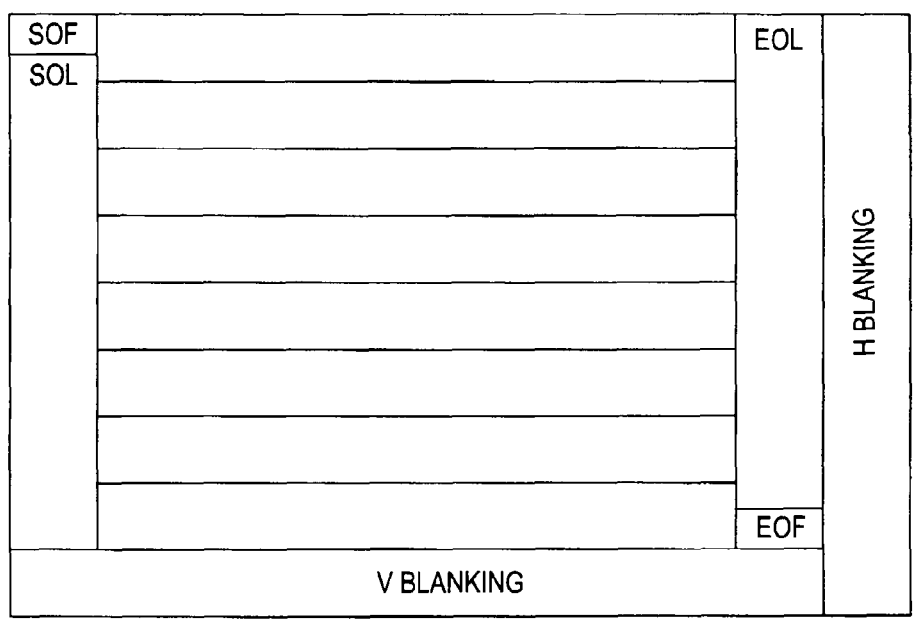
FIG. 3 is a diagram showing the data structure of image data which is generated by a sync-code adding section.

The sync-code adding section 33 adds a sync code to input pixel data for each image frame to generate image data. FIG. 3 shows one example of the data structure of image data which is generated by the sync-code adding section 33. As shown in FIG. 3, image data has an SOF (Start of File) header added to the head of pixel data of the first line, and an SOL (Start of Line) header added to the head of pixel data of each of the second and subsequent lines. Further, an EOL (End of Line) header is added to the end of pixel data of each line, except pixel data of the last line. An EOF (End of File) header is added to the end of pixel data of the last line.

The sync-code adding section 33 outputs image data line by line in order starting at the SOF header which is the head data of the first line, and terminates the data outputting after outputting the EOL header which is the last data of the last line. After outputting each line of pixel data, the sync-code adding section 33 does not output data for a predetermined period until outputting of the next line of pixel data is started. This period is the horizontal blanking (H Blanking) period. After outputting one piece of image data, the sync-code adding section 33 does not output data for a predetermined period until outputting of the next piece of image data is started. This period is the vertical blanking (V Blanking) period.

The image processing section 20 with the foregoing configuration can output image data, generated based on pixel data output from the pixel array section 10, to outside the solid-state imaging device 1. In the following description, the operation for outputting image data which is generated based on pixel data output from the pixel array section 10 to outside the solid-state imaging device 1 is referred to as "normal operation mode".

The image processing section 20 according to the embodiment can execute a test mode under control of the control circuit 42 in addition to the normal operation mode. The test mode is the operation to read and write test data in/from the memory 41 and output image data generated based on the read test data to outside the solid-state imaging device 1.

To execute the test mode, the image processing section 20 further includes a test circuit 21 so that a memory test on the memory 41 can be carried out fast with a simple circuit configuration. Based on a control signal input from the tester 71 or the like via the control interface 43, the control circuit 42 controls the image processing section 20 to operate in test mode.

The test circuit 21 has a test pattern generating section 22, a first selector 23, the comparison section 24 and a second selector 25 to test the memory 41.

The test pattern generating section 22, which functions as a test-data output section to output test data, generates and outputs test data to be written in the memory 41 to perform the memory test. The test pattern generating section 22 generates and outputs plural types of four lines of test data. Each test data is structured to have 4×n pieces of unit data each having, like pixel data, 12 bits.

The first selector 23 selectively outputs pixel data output from the pixel array section 10 and test data output from the test pattern generating section 22.

The comparison section 24 compares the test data directly output from the test pattern generating section 22 with the test data which is read out after being written in the memory 41.

The second selector 25 is used to change over data to be output to the sync-code adding section 33. That is, the second selector 25 selects and outputs either the pixel data output from the first selector 23 or the test data read from the memory 41 by the memory 41.

With the foregoing configuration, the solid-state imaging device 1 can executes two modes, "normal operation mode" and "test mode", based on the control signal input from the tester 71 or the like. The individual modes may be changed over upon operation of an operation button (not shown), not based on the control signal input from the tester 71 or the like.

1-3. Operation of Solid-state Imaging Device

Next, the operation of the solid-state imaging device 1 having the foregoing configuration will be described.

1-3-1. Normal Operation Mode

First, the operation of the solid-state imaging device 1 in normal operation mode will be described.

In normal operation mode, the control circuit 42 outputs a control signal for causing the first selector 23 to select pixel data output from the pixel array section 10. Then, the control circuit 42 controls the pixel array section 10 to sequentially output pixel data starting from the top pixel data of the first line. In response to a request from the control circuit 42, the memory control circuit 31 sequentially stores pixel data output from the pixel array section 10 through the test circuit 21. The memory control circuit 31 sequentially stores first to fourth lines of pixel data in memory areas in the memory 41 from an address 0 to an address 4n−1. Then, the memory control circuit 31 stores fifth to eighth lines of pixel data, sequentially output from the pixel array section 10 in the memory areas in the memory 41 from the address 0 to the address 4n−1 in an overwriting fashion. A similar operation is carried out for ninth and subsequent lines of pixel data.

In this manner, pixel data sequentially output from the pixel array section 10 from the top line is output through the test circuit 21 to be written at predetermined addresses in the memory 41 in a predetermined sequence.

The correction section 32 sequentially reads pixel data newly rewritten in the memory 41, performs a predetermined correction process thereon, and then outputs the resultant data to the sync-code adding section 33. The sync-code adding section 33 adds a sync code to the pixel data undergone the correction process and output from the correction section 32, and converts the pixel data to image data having information of n×m pixels to be output. The image data output from the sync-code adding section 33 is output outside via the image interface 44. The image data output in this manner is stored in, for example, a storage section 72 connected to the solid-state imaging device 1.

1-3-2. Test Mode

Next, the operation of the solid-state imaging device 1 in test mode will be described.

When the test mode is set, the control circuit 42 controls the test pattern generating section 22, the first selector 23, the second selector 25, and the sync-code adding section 33 to execute the memory test on the memory 41. The process in test mode will be specifically described below.

First, the control circuit 42 outputs a control signal to the first selector 23 to select test data output from the test pattern generating section 22. The control circuit 42 also outputs a control signal to the second selector 25 to output pixel data output from the test circuit 21 to the sync-code adding section 33. Further, the control circuit 42 outputs a control signal to the sync-code adding section 33 to create image data based on the input pixel data.

Next, the control circuit 42 outputs a control signal to the test pattern generating section 22 to output a test pattern. As a result, test data is sequentially output from the test pattern generating section 22. In response to a request from the control circuit 42, the memory control circuit 31 sequentially stores pixel data output from the pixel array section 10 through the test circuit 21. The writing sequence at this time is the same as the sequence of writing pixel data from the pixel array section 10. That is, the memory control circuit 31 stores the test data in the memory 41 in the same writing sequence as done in normal operation mode.

The test data which is sequentially output from the test pattern generating section 22 through the test circuit 21 is added with a sync code by the sync-code adding section 33 to be converted to image data which is in turn output. The image data output from the sync-code adding section 33 is output outside via the image interface 44. The tester 71 stores the image data input via the image interface 44 in the internal storage section of the tester 71.

Thereafter, the memory control circuit 31 reads the test data stored in the memory 41 in a predetermined sequence in response to request from the control circuit 42. The reading sequence at this time is the same as the sequence of pixel data from the pixel array section 10. That is, the memory control circuit 31 reads the test data stored in the memory 41 in the same reading sequence as done in normal operation mode.

Accordingly, the test data from the test pattern generating section 22 is written in the memory 41, and then read out to be converted to image data which is output to the tester 71.

The tester 71 can test the memory 41 by comparing the input image data with the aforementioned expected value data. That is, the tester 71 judges that the memory 41 is normal when the input image data coincides with the aforementioned expected value data, and judges that the memory 41 is defective when both data do not coincide with each other.

Since the sequences of writing and reading pixel data from the pixel array section 10 in and from the memory 41 are predetermined, a partial defect, if present in the memory 41, may not influence the operation of the solid-state imaging device 1. In other words, the memory 41 should not have an abnormality when the memory 41 is accessed in the predetermined writing sequence and the predetermined reading sequence, and it is unnecessary to prepare a variety of test patterns in consideration of random access. According to the embodiment, a test on a defective portion which does not influence the operation of the solid-state imaging device 1 is omitted to ensure a faster memory test.

This point will be specifically discussed below referring to FIGS. 4A to 4C.

Figure 4A:
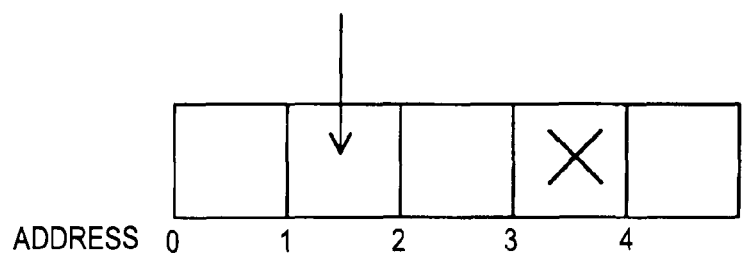
FIGS. 4A to 4C are diagrams showing the relation between a memory writing sequence and memory reading sequence.
Figure 4B:
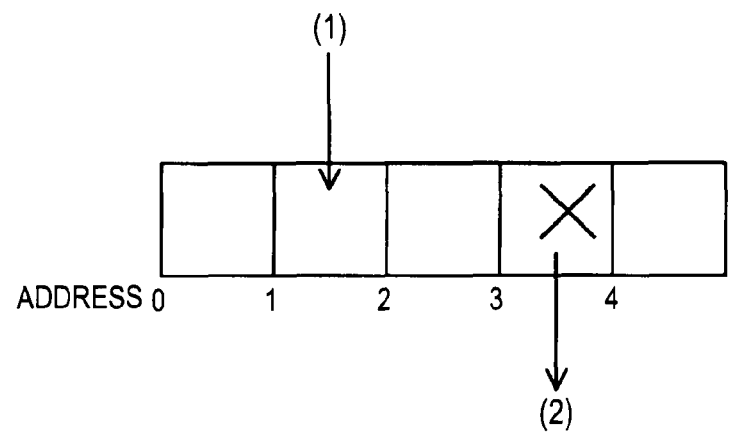
Figure 4C:
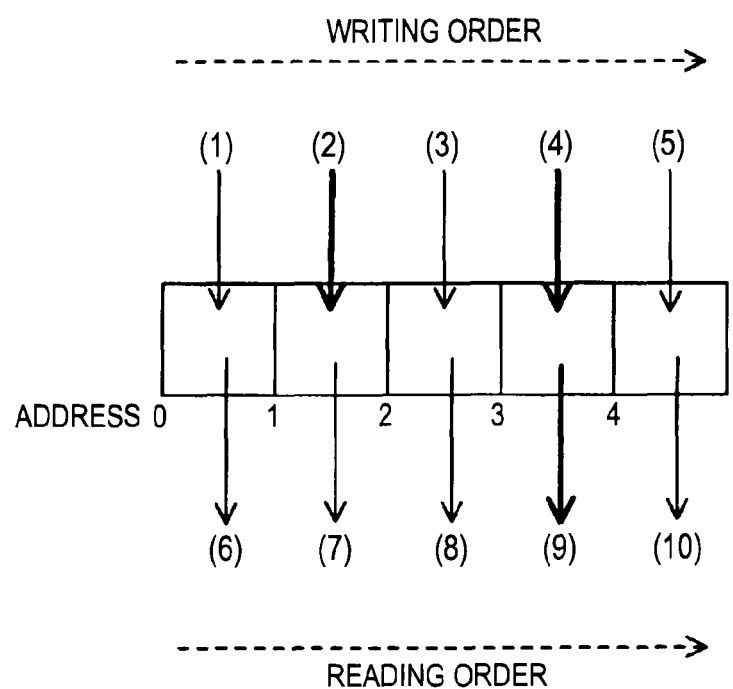

FIGS. 4A to 4C show the memory areas of addresses 0 to 4. It is assumed that those memory areas are defective such that when a value is written in the memory area of the address 1, a value stored in the memory area of the address 3 is rewritten to a predetermined value.

In case of performing random access to such a memory 41, when the access is carried out in the order as shown in FIG. 4B, for example, the value read from the memory 41 has an error. Specifically, when data is written in the memory area of the address 1 in an operation (1) and data is read the memory area of the address 3 in an operation (2), data read from the memory area of the address 3 becomes defective data containing an error.

In case of performing random access to the memory 41, therefore, a memory test for the above operations needs to be performed. As a result, the number of test patterns increases, so that the memory test for the memory 41 takes time.

When the writing sequence and reading sequence with respect to the memory 41 are determined as shown in FIG. 4C, on the other hand, the aforementioned defect in the memory area of the address 3 does not influence the operation of the solid-state imaging device 1. Even if the value in the memory area of the address 3 is rewritten when data is written in the memory area of the address 1 in the operation (2), new data is written in the memory area of the address 3 in an operation (4). Then, the data in the memory area of the address 3 is read out in an operation (9). Since proper data is written in the operation (4) before data is read from the memory area of the address 3 in the operation (9), the aforementioned defect in the memory area of the address 3 does not influence the operation of the solid-state imaging device 1.

Therefore, it is unnecessary to perform a memory test for a failure which influences the memory area of an address which will be rewritten later. This can reduce the number of test patterns, resulting in a faster memory test.

Next, the test patterns to be output from the test pattern generating section 22 and the operation using the test patterns will be described specifically. As mentioned above, each pixel data is 12-bit data having four bits for each of RGB, and is arranged in the order of R, G and B. Like pixel data, unit data of test data is 12-bit data.

The solid-state imaging device 1 according to the embodiment uses four kinds of test data each having unit data of "111111111111] (FFFh), "000000000000] (000h), "101010101010" (AAAh), and "010101010101" (555h). It is to be noted that "FFFh", "000h", "AAAh", and "555h" respectively correspond to white, black, bright gray, and dark gray.

In other words, the memory 41 is tested using four test data including test data having consecutive "0s" (first test data), test data having consecutive "1s" (second test data), test data having sequences of alternate "0" and "1" (third test data), and test data having sequences of alternate "1" and "0" (fourth test data).

The test pattern generating section 22 outputs units of test data corresponding to four lines of pixel data, as one unit, in the order of "000h"→"000h"→"FFFh"→"FFFh"→"555h"→"555h"→"AAAh"→"AAAh". The memory control circuit 31 writes the test data sequentially output from the test pattern generating section 22 in the memory 41, and then reads the written test data.

In this manner, the memory control circuit 31 writes over "0" in each memory element in the memory 41, writes "1" therein with "0" written, writes over "1" therein, and writes "0" therein with "1" written, and then reads data from each memory element in the memory 41. The writing and reading of each memory element in the memory 41 are carried out eight times.

The image processing section 20 adds a sync code to the test data read from the memory 41 to generate image data, and outputs the image data to the tester 71.

FIG. 5 shows one example of the data structure of two-dimensional image data which is output from the image processing section 20 in test mode. As shown in FIG. 5, image data has 32 lines or 4 lines×8 (reading number).

When a defect is not detected in the individual memory elements in the memory 41, image data having the same pixel value as the data written in the memory 41 is generated. That is, image data identical to expected value data is output to the tester 71 via the image interface 44.

When a failure of the memory elements is detected, on the other hand, image data different from expected value data is generated and output to the tester 71 via the image interface 44. In case of a defect such that the second significant bit in a memory element where the luminance value of R is stored always becomes High, a value which should be "000h" becomes "400h", and a value which should be "AAAh" becomes "EAAh".

Therefore, a defective memory element in the memory elements constituting the memory 41 can be specified by the tester 71 by specifying pixel data different from expected value data and specifying a memory element where the pixel data is stored.

According to the test mode of the embodiment, as described above, image data can be output outside through the same path as used in the normal operation mode. This eliminates the need for a special interface for testing the memory 41, making the circuit scale smaller. In addition, since data indicating the result of testing the memory 41 is output using the same fast interface as used in the normal operation mode, defect detection can be carried out fast. Further, the processing of the tester 71 is a simple process of comparing image data with expected value data, thus ensuring fast defect detection.

In the test mode according to the embodiment, four kinds of test patterns including writing over of "0", writing of "1" with "0" written, writing over "1", and writing "0" with "1" written can be performed on each memory element in the memory 41. In addition, since there are four pieces of unit data "000h", "FFFh", "555h", and "AAAh", the circuit scale of the test pattern generating section 22 can be minimized.

When a test pattern generating section which is used for another purpose is used in the embodiment, the test pattern generating section 22 need not be created newly, thus suppressing an increase in circuit scale, which leads to reduction in design cost.

2. Second Embodiment

Next, a solid-state imaging device according to the second embodiment of the invention will be described. Although the solid-state imaging device according to the foregoing first embodiment has the memory 41 formed by a single SRAM, the memory 41 may include a plurality of SRAMs. In this case, pixel data may be distributed in the individual SRAMS to be stored discontinuously.

FIGS. 6A and 6B are diagrams showing that the memory 41 includes four SRAMS, and the 0th to fourth pixel data in the pixel array section are stored. As shown in FIG. 6A, four SRAMS, SRAM0 to SRAM3, each having addresses 0 to (4*j*−1), each SRAM having four line buffers. Individual pieces of pixel data are stored dispersively.

It is assumed that when data is written in each memory element at the memory area corresponding to the address (j−1) in the SRAM0, a defect of rewriting the value of each memory element at the memory area corresponding to the address j in the SRAM0 with a predetermined value. In this case, when pixel data is written in the sequence of operations (1), ..., (J) and pixel data is read in the sequence of operations (1), ..., (J) at the same time, as shown in FIG. 6B, the defect of the memory element at the address j does not influence the operation of the solid-state imaging device 1.

Although data of the bit constituting (h−1)th pixel data is written in the memory element at the address (j−1), data at the memory element at the address j is read out before the former data is written. Accordingly, (h+1)th pixel data included in the data in the memory element at the address j is not influenced by the defect.

Therefore, it is unnecessary to test if the memory 41 has such a defect, thus making it possible to reduce the number of test patterns. As a result, the memory test can be performed fast.

When pixel data is not written in some memory areas in the SRAM2 and SRAM3 as mentioned above, a test on the memory areas need not be performed, thus ensuring a fast memory test.

Although the description of the second embodiment has been given of an example where four SRAMs are used, the embodiment can be adapted to a case where pixel data is arranged discontinuously in a single SRAM.

3. Other Embodiments

Although the embodiments of the invention have been specifically described, the invention is not limited to those embodiments, and may be modified in various manners based on the technical concept of the invention.

For example, the configuration may be modified so that a sync code is added in the correction section 32, and data is output from the image interface 44 without going through the sync-code adding section 33.

To visually check a defect in the memory 41, a display device may be connected to the solid-state imaging device 1, so that image data output from the image interface 44 is output to the display device in test mode.

Although the descriptions of the first embodiment and the second embodiment have been given of an electronic device using an SRAM, the invention can be adapted to other memory devices, such as DRAM.

The present application contains subject matter related to that disclosed in Japanese Priority Patent Application JP 2009-170586 filed in the Japan Patent Office on Jul. 21, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a pixel array section having a two-dimensional array of a plurality of pixels each having a photoelectric conversion section;
a memory that stores pixel data output from the pixel array section;
a correction section that reads the pixel data stored in the memory from the memory, and performs a correction process on the pixel data;
a control section that controls writing and reading of data into and from the memory;
an external interface used to output the pixel data subjected to the correction process; and
a test-data output section that outputs test data,
wherein the control section
writes the test data output from the test-data output section in a same writing sequence as a sequence of writing the pixel data output from the pixel array section into the memory, and
reads the test data written in the memory in a same reading sequence as a sequence of reading the pixel data output from the pixel array section from the memory, and outputting the pixel data via the external interface.

2. The solid-state imaging device according to claim 1, further comprising a sync-code adding section that adds a sync code to the test data read from the memory, and outputs the test data added with the sync code via the external interface.

3. The solid-state imaging device according to claim 1 or 2, wherein the memory is a line buffer for storing k lines of test data, and
the test-data output section outputs plural kinds of test data each kind containing k lines of test data.

4. The solid-state imaging device according to claim 3, wherein the test-data output section is capable of outputting k lines of first test data having a sequence of "0s" as a data value, k lines of second test data having a sequence of "1s" as a data value, k lines of third test data having an alternate sequence of "0s" and 1s" as a data value, and k lines of fourth test data having an alternate sequence of 1s" and "0s" as a data value, and outputs each test data twice.

5. The solid-state imaging device according to any one of claims 1 to 4, further comprising a selector that selectively outputs the test data output from the test-data output section and the pixel data output from the pixel array section,
wherein the control section controls the selector to change over data to be input to the memory.

6. The solid-state imaging device according to any one of claims 1 to 5, wherein the external interface is a differential interface.

\* \* \* \* \*